(12) United States Patent
Wang et al.

(10) Patent No.: US 6,777,983 B1
(45) Date of Patent: Aug. 17, 2004

(54) DIFFERENTIAL VOLTAGE TRANSMISSION CIRCUIT

(75) Inventors: Shin-Lin Wang, Hsinchu (TW); Kun-Chih Chang, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/443,004

(22) Filed: May 22, 2003

(51) Int. Cl.⁷ .............................................. H03K 5/22
(52) U.S. Cl. .............................. 327/65; 327/66; 327/67; 327/108; 327/379
(58) Field of Search ............................. 327/65–67, 72, 327/73, 76, 108, 109, 379, 539, 560; 455/126, 127.1; 375/257; 326/22, 26, 30, 82, 86

(56) References Cited

U.S. PATENT DOCUMENTS

| | | | |
|---|---|---|---|
| 6,097,245 A | * | 8/2000 | Dobbelaere et al. ........ 327/560 |
| 6,111,431 A | * | 8/2000 | Estrada ........................ 326/83 |
| 6,590,436 B2 | * | 7/2003 | Jordanger et al. ............ 327/67 |
| 6,650,149 B1 | * | 11/2003 | Wong .......................... 327/65 |

\* cited by examiner

*Primary Examiner*—Long Nguyen
(74) *Attorney, Agent, or Firm*—Rabin & Berdo, P.C.

(57) ABSTRACT

A differential voltage transmission circuit. The reference bias circuit outputs a first reference voltage, a second reference voltage and a reference current corresponding to a reference current adjusting signal. The differential comparator compares the difference between the first reference voltage and the second reference voltage with the difference between a first output voltage and a second output voltage, and outputs a result signal corresponding to the compared result. The decision circuit outputs the reference current adjusting signal corresponding to the result signal. The output circuit outputs the first output voltage and the second output voltage generated at both terminals of a termination resistor when the reference current flows through the termination resistor.

5 Claims, 4 Drawing Sheets

US 6,777,983 B1

DIFFERENTIAL VOLTAGE TRANSMISSION CIRCUIT

BACKGROUND OF THE INVENTION

1. Field of the Invention

The present invention relates in general to a differential voltage transmission circuit. In particular, the present invention relates to a differential voltage transmission circuit with adjustable reference current.

2. Description of the Related Art

FIG. 1 shows a conventional differential voltage transmission circuit. The conventional differential voltage transmission circuit comprises a bandage reference circuit 10 to provide a bandgap bias $V_{bg}$. The reference current $I_{ref}$ is generated by the bandgap bias $V_{bg}$ and the external resistor $R_{ext}$. Next, the reference current $I_{ref}$ is output to transmitter 12. The transmitter 12 comprises an external termination resistor $R_{term}$. When the reference current $I_{ref}$ flows through the external termination resistor $R_{term}$, a first output voltage $V_{op}$ and a second output voltage $V_{on}$ are generated at both terminals of the termination resistor $R_{term}$, then the output voltage $V_o$ is generated, that is, the difference between the first output voltage $V_{op}$ and the second output voltage $V_{on}$.

Because the reference current $I_{ref}$ is influenced by the external resistor $R_{ext}$, the value of the external resistor $R_{ext}$ must be very exact to avoid influencing the reference current $I_{ref}$. Thus, the external resistor $R_{ext}$ is fabricated by another factory, after confirming the actual resistance, then the external resistor $R_{ext}$ is set on the circuit board to generate an exact reference current $I_{ref}$.

However, the circuit board must add via holes to set up the external resistor $R_{ext}$. The additional external resistor $R_{ext}$ and via holes, however, increase costs and complicate the fabricating process.

To solve the cost problem, the external resistor $R_{ext}$ is replaced with an internal resistor formed with the bandage reference circuit 10 by CMOS process. Thus, the cost of the external resistor $R_{ext}$ is economized. However, errors with the internal resistor formed by CMOS process are increased to as much as ±30%, which cannot provide a demanding reference current.

SUMMARY OF THE INVENTION

The object of the present invention is to provide a differential voltage transmission circuit that provides the reference current by adjustment without using the external resistor.

To achieve the above-mentioned object, the differential voltage transmission circuit comprises a reference bias circuit, a differential comparator, a decision circuit, and an output driving circuit. The reference bias circuit outputs a first reference voltage, a second reference voltage and a reference current corresponding to a reference current adjusting signal. The differential comparator compares the difference between the first reference voltage and the second reference voltage with the difference between a first output voltage and a second output voltage, and outputs a result signal corresponding to the compared result. The decision circuit outputs the reference current adjusting signal corresponding to the result signal. The output circuit outputs the first output voltage and the second output voltage generated at both terminals of a termination resistor when the reference current flows through the termination resistor.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
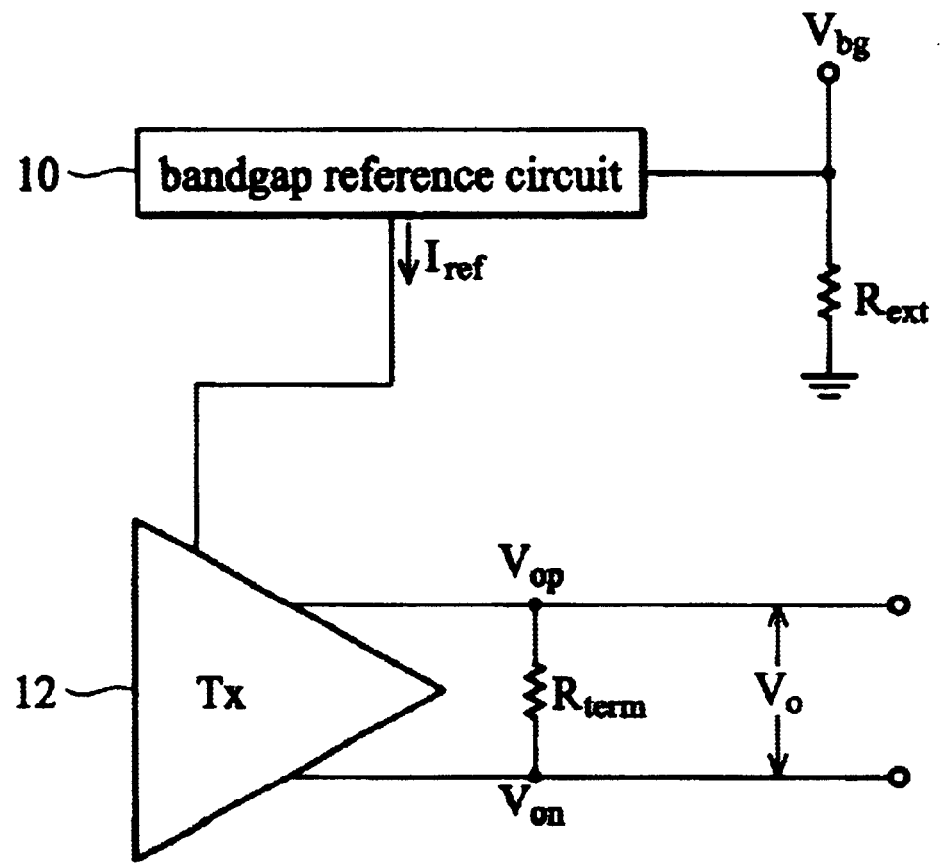
FIG. 1 shows the conventional differential voltage transmission circuit.
Figure 2:
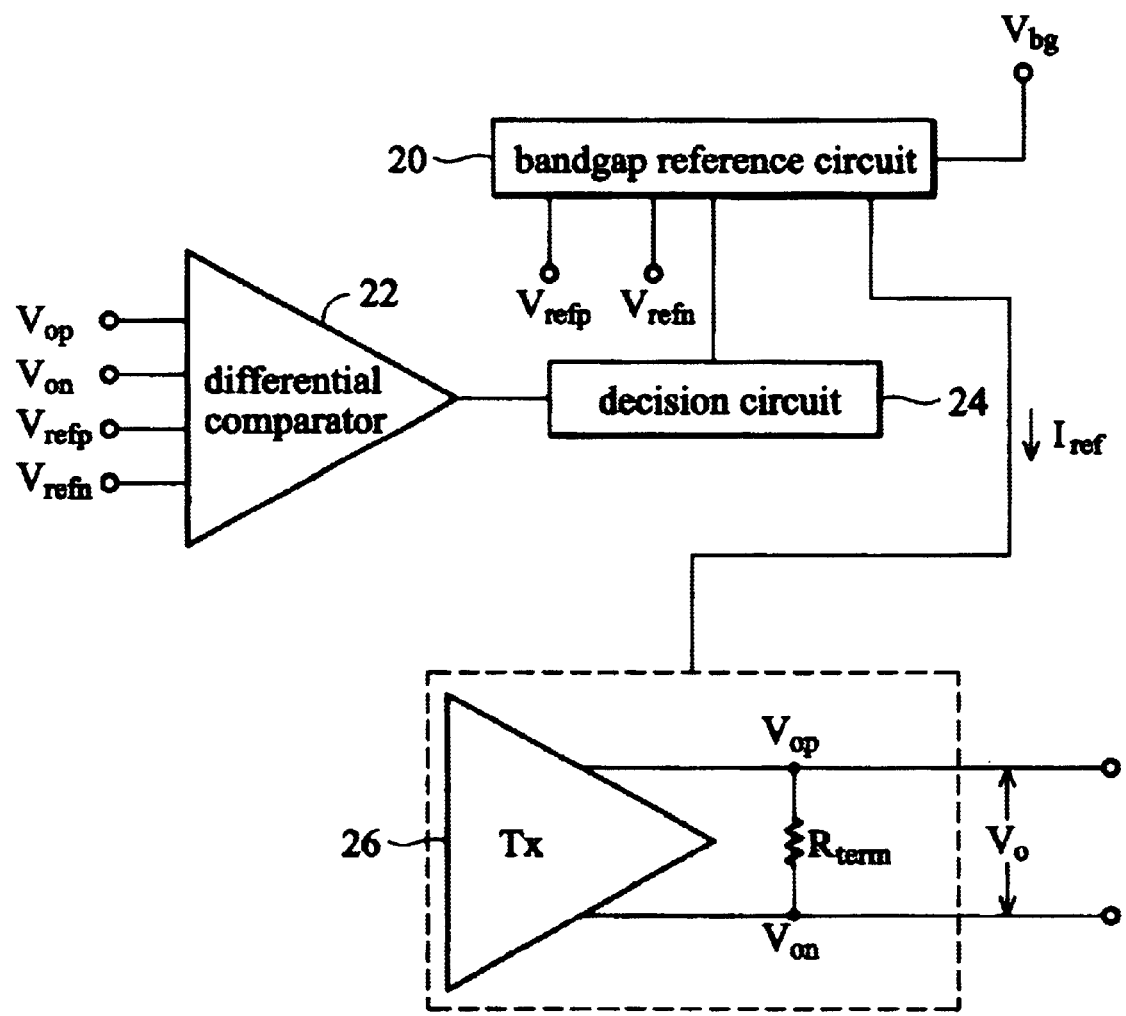
FIG. 2 shows the differential voltage transmission circuit according to the embodiment of the present invention.

FIG. 2 shows the differential voltage transmission circuit according to the embodiment of the present invention. The differential voltage transmission circuit according to the embodiment of the present invention comprises a bandage reference circuit 20 to provide a reference current $I_{ref}$, reference voltage $V_{refp}$ and $V_{refn}$.

Figure 3:
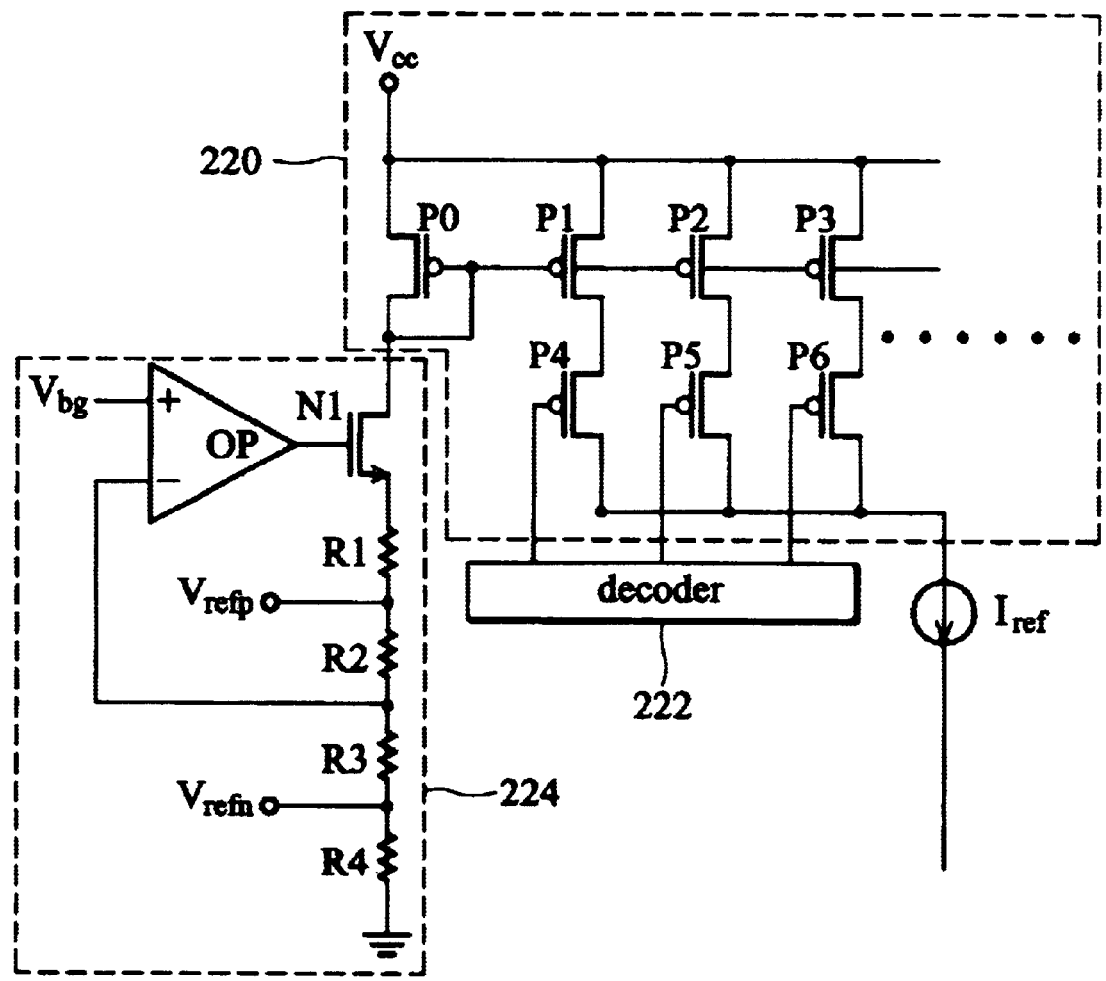
FIG. 3 shows the circuit block of the bandage reference circuit 20 according to the embodiment of the present invention.

FIG. 3 shows the circuit block of the bandage reference circuit 20 according to the embodiment of the present invention. The bandage reference circuit 20 comprises a current mirror circuit 220, a decoder 222 and a reference voltage generator 224. Assuming the PMOS transistors P0~P3 are all the same, the output current of the activated PMOS transistors P4~P6 is approximately equal to the drain current of the PMOS transistors P0. Here, the output current terminals are the drains of the PMOS transistors P4~P6, and the combined output current forms the reference current $I_{ref}$.

The reference voltage generator 224 comprises an operation amplifier OP, an NMOS transistor N1 and resistors R1~R4. The resistor chain is connected between the source of the NMOS transistor N1 and ground. The gate of the NMOS transistor N1 is connected to the output of the operation amplifier OP. In addition, the non-reverse input terminal of the operation amplifier OP receives voltage $V_{bg}$, and the reverse input terminal of the operation amplifier OP is coupled to the connection point of the resistors R2 and R3. Thus, the reference voltage $V_{refp}$ and the $V_{refn}$ are obtained at the connection points of the resistors R1, R2 and R3, R4, respectively.

Thus, when the decoder 222 activates at least one of the PMOS transistors P4~P6, the value of the output reference current $I_{ref}$ is the multiple of the drain current of PMOS transistor P0, and the multiple is the number of the activated PMOS transistor.

The differential comparator 22 compares the difference between the reference voltage $V_{refp}$ and $V_{refn}$ with the difference between the output voltage $V_{op}$ and the output voltage $V_{on}$. We can set the reference voltage $V_{refp}$ and the $V_{refn}$ correctly and use the reference voltage $V_{refp}$ and the $V_{refn}$ to compare with the output voltage. When the difference between the reference voltage $V_{refp}$ and $V_{refn}$ is higher than the difference between the output voltage $V_{op}$ and $V_{on}$, the result signal output from the differential comparator 22 is high, otherwise, the result signal is low.

Figure 4:
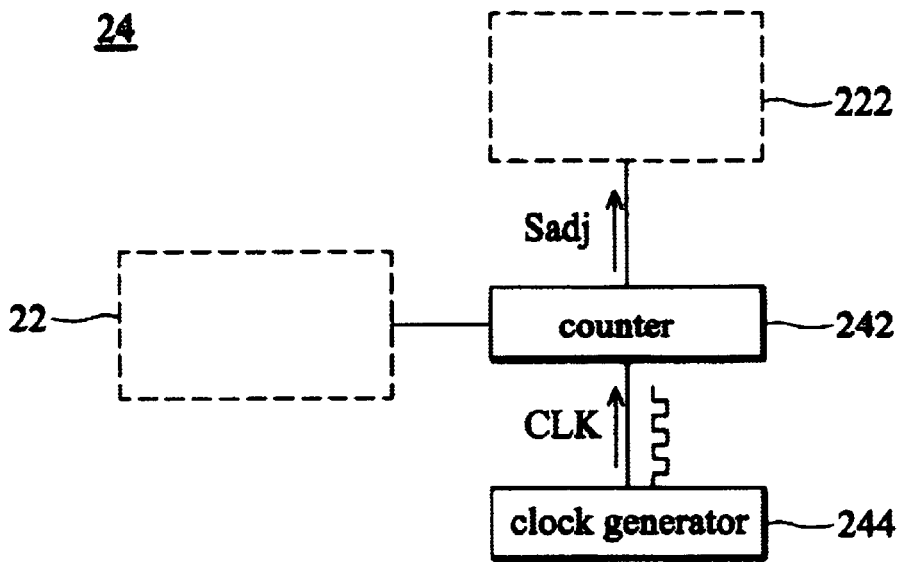
FIG. 4 shows the decision circuit 24 according to the embodiment of the present invention.

FIG. 4 shows the decision circuit 24 according to the embodiment of the present invention. The decision circuit 24 comprises a counter 242 to generate according to the result signal. The counter 242 is triggered by the clock signal CLK output by the clock generator 244. When the result signal is high, the counter 242 is enabled and the value of the counter 242 is increased. The counter value is the reference current adjusting signal $S_{adj}$, output to the decoder 222. When the decoder 222 detects the reference current adjusting signal $S_{adj}$, the decoder 222 transforms the reference current adjusting signal $S_{adj}$ to an indicating signal representing the value of the counter 242 and activates the number of the PMOS transistors corresponding to the value of the counter 242 to adjust the reference current $I_{ref}$. Here, if the value of the counter 242 is increases, the reference current $I_{ref}$ increases.

Figure 5:
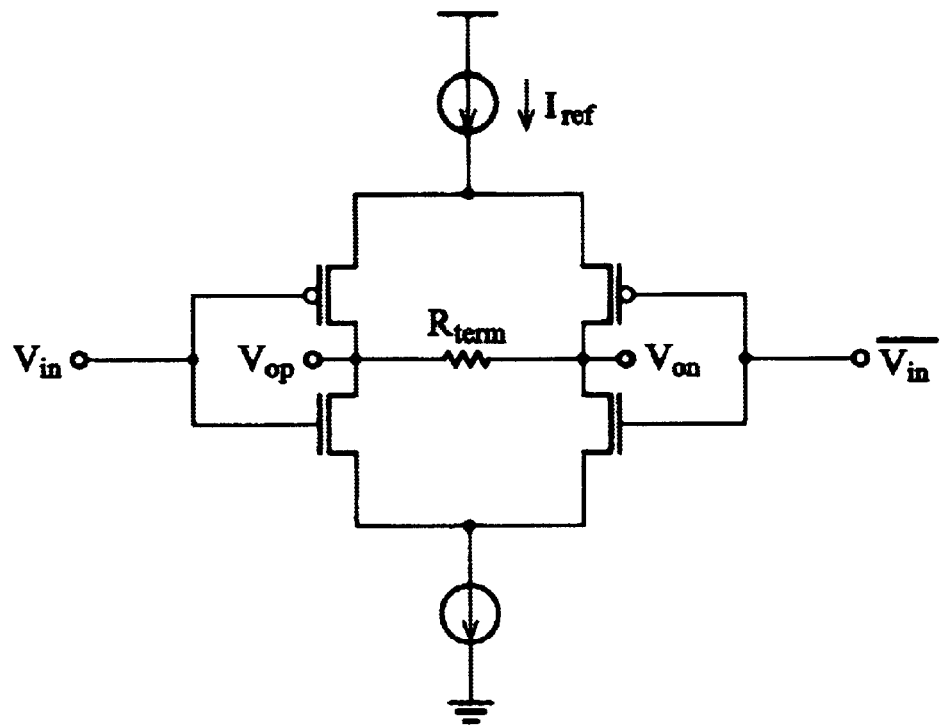
FIG. 5 shows the transmitter 26 according to the embodiment of the present invention.

Next, the reference current $I_{ref}$ is output to the transmitter 26. FIG. 5 shows the transmitter 26 according to the embodiment of the present invention. The transmitter 26 comprises a termination resistor $R_{term}$ and MOS transistors. When the transmitter 26 is enabled by the input signal $V_{in}$, the reference current $I_{ref}$ flows through the termination resistor $R_{term}$, then a first output voltage $V_{op}$ and a second output voltage $V_{on}$ are generated at both terminals of the termination resistor $R_{term}$. Thus, the output voltage $V_o$ is generated, that is, the difference between the output voltage $V_{op}$ and the output voltage $V_{on}$.

According to the present invention, a higher difference between the reference voltage $V_{refp}$ and $V_{refn}$ than between the output voltage $V_{op}$ and $V_{on}$ indicates that the reference current $I_{ref}$ is not large enough. Therefore, the reference current $I_{ref}$ keeps increasing until the difference between the output voltage, $V_{op}$ and the output voltage $V_{on}$ is equal to the difference between the reference voltage $V_{refp}$ and $V_{refn}$. Since the reference current $I_{ref}$ is adjustable, the external resistor $R_{ext}$ is replaced, by the resistor formed by CMOS process. Therefore, the additional external resistor $R_{ext}$ and via holes are unnecessary and the cost of the circuit is decreased.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A differential voltage transmission circuit, comprising:

a reference bias circuit for outputting a first reference voltage, a second reference voltage and a reference current corresponding to a reference current adjusting signal;

a differential comparator for comparing the difference between the first reference voltage and the second reference voltage with the difference between a first output voltage and a second output voltage, and outputting a result signal corresponding to the comparison result;

a decision circuit for outputting the reference current adjusting signal corresponding to the result signal; and an output driving circuit for outputting the first output voltage and the second output voltage generated at both terminals of a termination resistor when the reference current flows through the termination resistor.

2. The differential voltage transmission circuit as claimed in claim 1, wherein the reference bias circuit comprises a current mirror circuit and a decoder.

3. The differential voltage transmission circuit as claimed in claim 2, wherein the current mirror circuit comprises a plurality of current output terminals and a plurality of switches corresponding to the current output terminals.

4. The differential voltage transmission circuit as claimed in claim 3, wherein the decoder activates the switches according to the reference current adjusting signal.

5. The differential voltage transmission circuit as claimed in claim 1, wherein the decision circuit comprises a counter to generate the reference current adjusting signal according to the result signal.

* * * * *